(12) United States Patent
Migliavacca

(10) Patent No.: US 8,737,032 B2
(45) Date of Patent: May 27, 2014

(54) METHOD FOR LIMITING AN UN-MIRRORED CURRENT AND CIRCUIT THEREFOR

(75) Inventor: Paolo Migliavacca, Mauzac (FR)

(73) Assignee: Semiconductor Components Industries, LLC, Phoenix, AZ (US)

(*) Notice: Subject to any disclaimer, the term of this patent is extended or adjusted under 35 U.S.C. 154(b) by 495 days.

(21) Appl. No.: 12/863,389

(22) PCT Filed: Mar. 10, 2008

(86) PCT No.: PCT/US2008/056409
§ 371 (c)(1),
(2), (4) Date: Jul. 16, 2010

(87) PCT Pub. No.: WO2009/114006
PCT Pub. Date: Sep. 17, 2009

(65) Prior Publication Data
US 2011/0043959 A1    Feb. 24, 2011

(51) Int. Cl.
*H02H 9/08* (2006.01)
*H02H 3/08* (2006.01)

(52) U.S. Cl.
USPC .................................. 361/93.9; 361/93.1

(58) Field of Classification Search
USPC ................................. 361/93.9, 93.1
See application file for complete search history.

(56) References Cited

U.S. PATENT DOCUMENTS

| | | | | |
|---|---|---|---|---|
| 5,683,919 A | * | 11/1997 | Tserng | 438/122 |
| 7,477,502 B1 | * | 1/2009 | Faulkner et al. | 361/93.7 |
| 2006/0238944 A1 | * | 10/2006 | Yamamoto | 361/93.1 |
| 2008/0253047 A1 | * | 10/2008 | Takihara et al. | 361/57 |

FOREIGN PATENT DOCUMENTS

| | | | |
|---|---|---|---|
| CN | 20061083064 | | 12/2007 |
| EP | 1 775 764 | * | 4/2007 |
| EP | 1876710 | * | 1/2008 |

* cited by examiner

*Primary Examiner* — Jared Fureman
*Assistant Examiner* — Lucy Thomas
(74) *Attorney, Agent, or Firm* — Rennie William Dover

(57) ABSTRACT

A current limit circuit and a method for limiting current flow. The current limit circuit includes a transistor having a control electrode and current carrying electrodes. A wire is coupled to one of the current carrying electrodes. An output of a comparator is coupled to the control electrode of the transistor through a charge pump. One input of the comparator is coupled to the current carrying electrode of the transistor that is coupled to the wire and the other input of the comparator is coupled for receiving a voltage. Preferably the wire is a bond wire. The current flowing through the wire sets the input voltage appearing at the input of the comparator coupled to the current carrying electrode of the transistor. In response to the comparison of the voltages at the input of the comparator, the transistor remains turned-on or it is turned-off.

20 Claims, 2 Drawing Sheets

-PRIOR ART-

US 8,737,032 B2

METHOD FOR LIMITING AN UN-MIRRORED CURRENT AND CIRCUIT THEREFOR

TECHNICAL FIELD

The present invention relates, in general, to semiconductor components and, more particularly, to protecting a circuit from an over-current.

BACKGROUND

Telecommunications, network, and computer applications often require the ability to insert and remove battery equipped systems from accessories. During these operations an undesired short condition can appear on the connector leading to currents of several amperes of peak amplitude, which can damage the circuitry and the battery. To prevent such deleterious effects, protection circuits are coupled to the connector interface and have current limit capabilities that control a power MOSFET switch through which the supply current is routed.

Existing current limiters suffer from a high cost due to the large number of components needed to control the power MOSFET switch in a fashion that limits the current to a specified level. In addition, the use of integrated circuit techniques to limit current flow are unsuitable for use with discrete power MOSFETS because of deficiencies inherent in coupling a discrete power MOSFET to an integrated circuit. For example, FIG. 1 illustrates a prior art current limit circuit 10 in which a switch 12 is coupled to an integrated circuit 14. It should be noted that switch 12 is a discrete component whereas integrated circuit 14 is a monolithically integrated circuit. In other words, switch 12 and integrated circuit 14 are manufactured from two separate silicon substrates. Switch 12 comprises a power MOSFET 16 having a source, a drain, and a gate. Integrated circuit 14 comprises MOSFETS 20 and 22, resistors 24, 26, and 28, an amplifier 30, a comparator 32, and a charge pump 34. Unlike power MOSFET 16 which is manufactured using a semiconductor process tailored for discrete power devices, MOSFETS 20 and 22 are manufactured using a process tailored for integrated circuits. MOSFET 20 has a drain coupled to an input node 36 through resistor 24, a source coupled to a ground potential through resistor 26, and a gate coupled to an output of amplifier 30. Amplifier 30 has an input coupled for receiving a reference potential $V_{REF}$ and an input coupled to the source of MOSFET 20. One input of comparator 32 is coupled to the drain of MOSFET 20 and the other input is coupled to the drain of MOSFET 22 and to one terminal of resistor 28. The other terminal of resistor 28 is coupled to input node 36. The output of comparator 32 is connected to an input of charge pump 34 and the output of charge pump 34 is connected to the gate of MOSFET 22. The source of MOSFET 22 is connected to an output node 38. An output voltage $V_{OUT}$ appears at output node 38.

Switch 12 and integrated circuit 14 are mounted to a support structure such as a printed circuit board and the drain and source of power MOSFET 16 are coupled to input node 36 and output node 38, respectively, and the gate of power MOSFET 16 is connected to the gate of MOSFET 22. Thus the output of charge pump 34 is commonly connected to the gates of power MOSFET 16 and MOSFET 22 and the sources of MOSFET 22 and power MOSFET 16 are connected together.

In operation, amplifier 30 in combination with MOSFET 20, resistors 24 and 26, input voltage $V_{IN}$ at input node 36, and reference voltage $V_{REF}$ generate a voltage $V_1$ at one input of comparator 32. Power MOSFET 16 and MOSFET 22 are configured as a current mirror such that a current $I_1$ flows through power MOSFET 16 when it is on and conducting current and a mirror current $I_{1M}$ flows through MOSFET 22 when it is on and conducting current. Mirror current $I_{1M}$ in combination with resistor 28 and a voltage $V_{IN}$ appearing at input node 36 generate a reference voltage $V_2$ at the other input node of comparator 32. If mirror current $I_{1M}$ is outside a safe operating range, voltage $V_2$ will be less than voltage $V_1$ and comparator 32 generates an output signal that disables charge pump 34. Disabling charge pump 34 turns off power MOSFET 16 and MOSFET 22 thereby limiting the levels of current $I_1$ and mirror current $I_{1M}$. If mirror current $I_{1M}$ is within a safe operating range, voltage $V_2$ will be greater than voltage $V_1$ and comparator 32 generates an output signal that enables charge pump 34. Enabling charge pump 34 leaves power MOSFET 16 and MOSFET 22 on and conducting current $I_1$ and mirror current $I_{1M}$. A drawback with this circuit configuration is that power MOSFET 16 and MOSFET 22 are manufactured from different silicon substrates, thus mirror current $I_{1M}$ does not match current $I_1$. This mismatch introduces inaccuracies in the signals from the current mirror circuit and thus in the signals from the current limit circuit that may lead to over-current conditions that can catastrophically damage switch 12, integrated circuit 14, or both. A drawback with manufacturing switch 12 and integrated circuit 14 using the same substrate and the same manufacturing process is that the process requirements would be set by power MOSFET 12. Manufacturing MOSFETS 20 and 22 using a manufacturing process tailored for power MOSFET 16 degrades their performance making them unsuitable in a current limiting application.

Accordingly, it would be advantageous to have a current limit circuit and a method for limiting current that includes the use of semiconductor components manufactured using different process flows without ideal current matching. It would be of further advantage for the circuit and method to be time and cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Generally, the present invention provides a method and a structure for limiting current flow in a semiconductor component. In accordance with one embodiment of the present invention, a method for protecting a circuit from an over-current comprises generating first and second voltages where the second voltage is generated using an un-mirrored current.

The first and second voltages are compared to each other and a comparison voltage is generated in response to the comparison. The un-mirrored current flow is either impeded or left flowing in accordance with the comparison voltage.

In accordance with another embodiment of the present invention, a method for limiting an un-mirrored current comprises sensing a current level of an un-mirrored current flowing through a wire and operating a charge pump in response to the un-mirrored current level.

In accordance with another embodiment of the present invention, a current limit circuit is provided that comprises a transistor having a control electrode and current carrying electrodes. A wire is coupled to one of the current carrying electrodes. An output of a comparator is coupled to the control electrode of the transistor through a charge pump. One input of the comparator is coupled to the current carrying electrode of the transistor that is coupled to the wire and the other input of the comparator is coupled for receiving a voltage. Preferably bond wire 114 is between approximately 25 milli-Ohms (mΩ) and approximately 30 mΩ.

Figure 1:
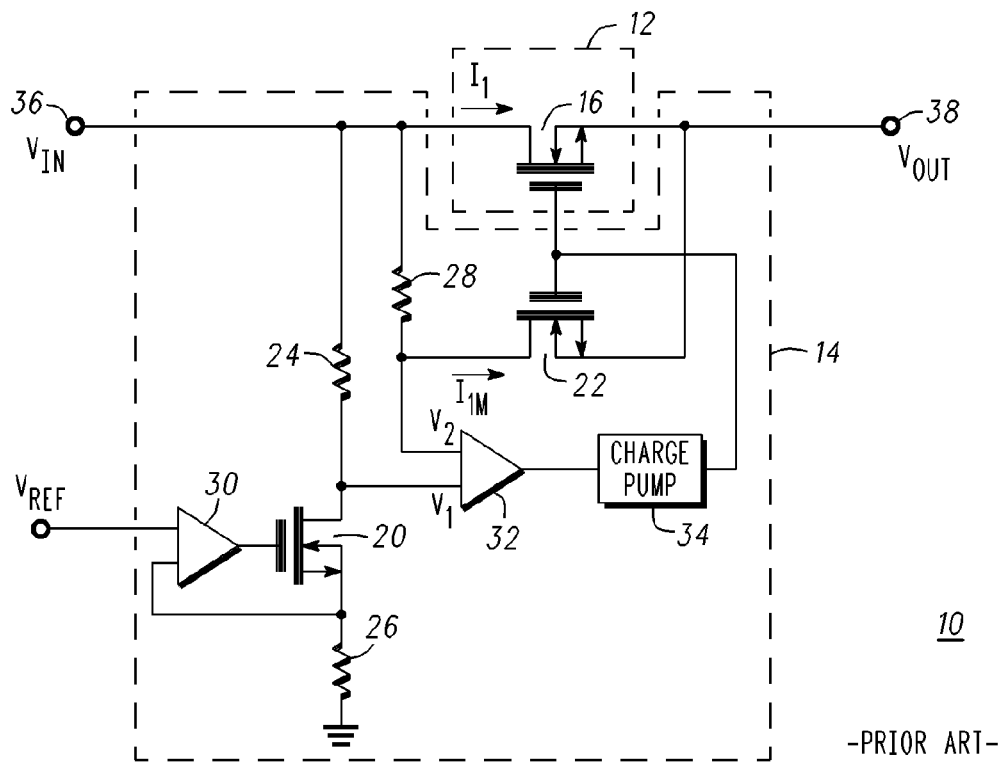
FIG. 1 is a circuit diagram of a prior art current limit circuit.
Figure 2:
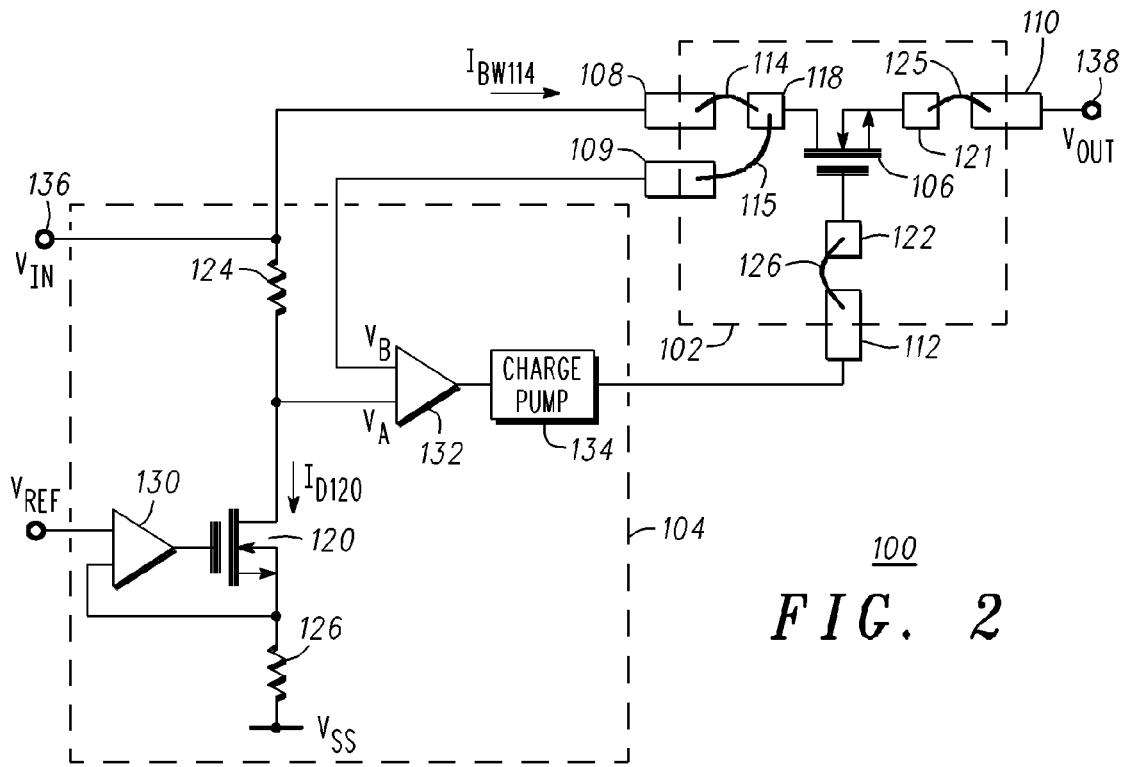
FIG. 2 is a circuit diagram of a current limit circuit in accordance with an embodiment of the present invention.
Figure 3:
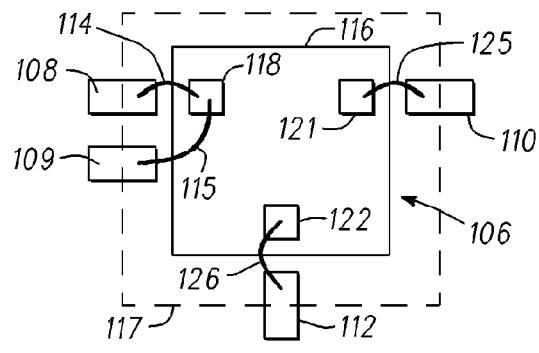
FIG. 3 illustrates a top view of a switch from the current limit circuit of FIG. 2 before encapsulation by a packaging material.

FIG. 2 is a circuit diagram of current limit circuit 100 in accordance with an embodiment of the present invention. What is shown in FIG. 2 is a switch 102 coupled to an integrated circuit 104. It should be noted that switch 102 is a discrete component whereas integrated circuit 104 is a monolithically integrated circuit. In other words, switch 102 and integrated circuit 104 are manufactured from two separate silicon substrates. Switch 102 comprises a power MOSFET 106 having a source, a drain, and a gate. The drain of power MOSFET 106 is coupled to a leadframe lead 108 of switch 102 by a wirebond 114. Briefly referring to FIG. 3, power MOSFET 106 is formed from a semiconductor substrate 116 and has a drain bond pad 118, a source bond pad 121, and a gate bond pad 122 formed on a surface. It should be noted that FIG. 3 is a top view of switch 102 before encapsulation by a packaging material such as, for example, a mold compound in accordance with an embodiment of the present invention. For the sake of completeness, a broken line 117 is included that illustrates the outline of the mold compound after encapsulating semiconductor substrate 116 and portions of leadframe leads 108, 109, 110, and 112. Semiconductor substrate 16 is coupled to a leadframe flag (not shown). Drain bond pad 118 is coupled to leadframe lead 108 by bond wire 114 and to leadframe lead 109 by a bond wire 115, source bond pad 121 is coupled to leadframe lead 110 by a bond wire 125, and gate bond pad 122 is coupled to gate lead 112 by a bond wire 126. The drain and source of a MOSFET are also referred to as current carrying electrodes and the gate of a MOSFET is also referred to as a control electrode.

Figure 4:
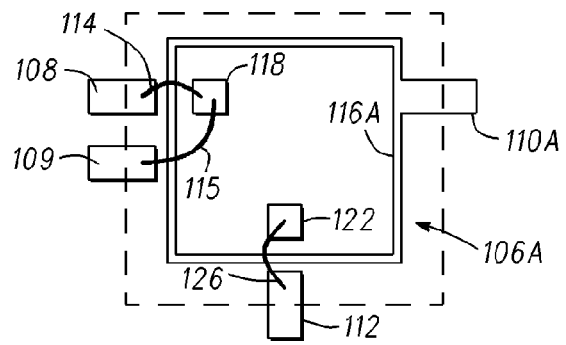
FIG. 4 illustrates a switch suitable for use in the current limit circuit of FIG. 2 before encapsulation by a packaging material in accordance with another embodiment of the present invention.

The configuration of switch 102 is not a limitation of the present invention. For example, a semiconductor switch may be comprised of a vertically oriented semiconductor device. FIG. 4 a top view of a switch 102A before encapsulation by a packaging material in accordance with another embodiment of the present invention in which switch 102A comprises a vertically oriented power MOSFET 106A. By way of example, power MOSFET 106A has drain and gate bond pads formed from one surface of a semiconductor substrate 116A and a source contact formed from an opposing surface of the semiconductor substrate. The drain and gate bond pads may also be referred to as drain and gate contacts. What is shown in FIG. 4 is vertically oriented power MOSFET 106A having a bottom-side source in contact with a leadframe flag or paddle, wherein a portion of the leadframe lead extends from a mold compound and serves as a source terminal 110A. Thus a source bond wire is absent from switch 102A. Like power MOSFET 106, vertically oriented power MOSFET 106A has a drain bond pad 118 coupled to leadframe lead 108 by bond wire 114 and to leadframe lead 109 by bond wire 115, and a gate bond pad 122 coupled to gate lead 112 by a bond wire 126. The current limit operation of switch 102A is similar to that of switch 102. It should be noted that the letter "A" has been appended to reference characters 102, 106, 110, and 116 to distinguish elements of the power MOSFET 106 that may have a different configuration from those of vertical power MOSFET 106A.

Referring again to FIG. 2, integrated circuit 104 comprises a MOSFET 120, resistors 124 and 126, an amplifier 130, a comparator 132, and a charge pump 134. Unlike power MOSFET 106 which is manufactured using a semiconductor process tailored for discrete power devices, MOSFET 120 is manufactured using a process tailored for integrated circuits. MOSFET 120 has a drain coupled to leadframe lead 108 through resistor 124, a source coupled for receiving a source of operating potential $V_{SS}$ through resistor 126, and a gate coupled to an output of amplifier 130. By way of example, source of operating potential $V_{SS}$ is ground potential. Leadframe lead 108 serves as an input/output node for switch 102. Leadframe lead 108 is connected to an input node 136 of current limit circuit 100 at which an input voltage $V_{IN}$ is received. Amplifier 130 has an input coupled for receiving a reference potential $V_{REF}$ and an input coupled to the source of MOSFET 120. One input of comparator 132 is coupled to the drain of MOSFET 120 and the other input is coupled to the drain of power MOSFET 106 and to drain bond pad 118 through leadframe lead 109 and bond wire 115. Bond pad 118 is coupled to leadframe lead 108 by a bond wire 114. The output of comparator 132 is connected to an input of charge pump 134 and the output of charge pump 134 is connected to gate lead 112 of power MOSFET 106. Gate lead 112 is coupled to gate bond pad 122 by bond wire 126. The source of power MOSFET 106 is connected to leadframe lead 110 by bond wire 125 (shown in FIGS. 2 and 3). Leadframe lead 110 is connected to an output node 138 of current limit circuit 100 at which an output voltage $V_{OUT}$ is provided.

Figure 5:
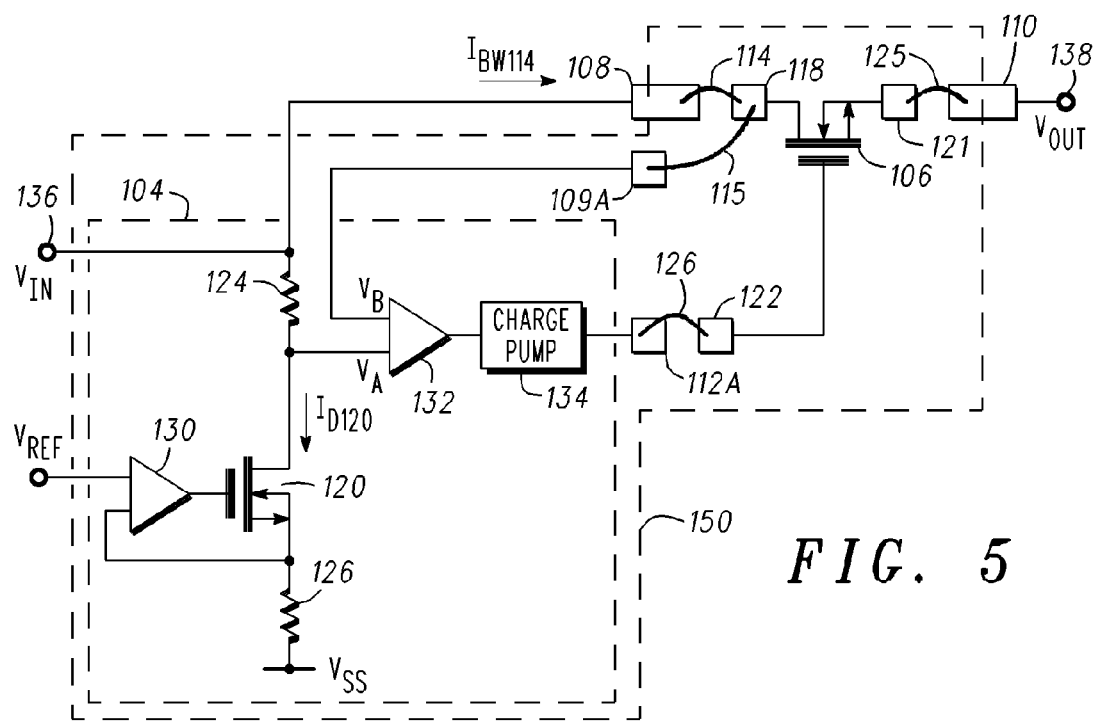
FIG. 5 is a circuit diagram of a current limit circuit in accordance with another embodiment of the present invention.

FIG. 5 is a circuit schematic of a current limit circuit 150 in accordance with another embodiment of the present invention. What is shown in FIG. 5 is a power MOSFET 106 and an integrated circuit 104 packaged as a multi-chip module in which leadframe leads 109 and 112 are replaced with bond pads 109A and 112A, respectively. Power MOSFET 106 and integrated circuit 104 are mounted to a support substrate and encapsulated within a mold compound. Thus, the signal detected from the drain of power MOSFET 106 and the signal transmitted to the gate of power MOSFET 106 are internal to the packaged current limit circuit 150.

In operation, amplifier 130 in combination with MOSFET 120, resistors 124 and 126, input voltage $V_{IN}$ at input node 136, reference voltage $V_{REF}$, and operating potential $V_{SS}$ generate a voltage $V_A$ at one input of comparator 132. More particularly, when voltages $V_{REF}$ and $V_{IN}$ have values such that MOSFET 120 is turned on and conducting a drain current $I_{D120}$, voltage $V_A$ appears at one of the inputs of comparator 132. Voltage $V_A$ may be given by either equation 1 (EQT. 1), equation 2 (EQT. 2), or equation 3 (EQT. 3) as:

$$V_A = V_{SS} + I_{D120} * R_{126} + V_{DS120} \qquad \text{EQT. 1}$$

$$V_A = V_{IN} - I_{D120} * R_{124} \qquad \text{EQT. 2}$$

$$V_A = V_{IN} - R_{124}/R_{126} * V_{REF} \qquad \text{EQT. 3}$$

where:

$R_{124}$ is the resistance value of resistor 124;

$R_{126}$ is the resistance value of resistor 126;

$I_{D120}$ is the drain current of MOSFET 120;
$V_{REF}$ is a reference voltage;
$V_{DS120}$ is the drain-to-source voltage of MOSFET 120; and
$V_{SS}$ is a source of operating potential.

When voltages $V_{REF}$ and $V_{IN}$ have values such that MOSFET 120 is turned off and non-conducting, voltage $V_A$ is substantially equal to input voltage $V_{IN}$.

When voltage $V_{IN}$ and the voltage at the gate of power MOSFET 106 have values such that power MOSFET 106 is turned on and conducting an un-mirrored current $I_{BW114}$ through bond wire 114 that is within the current specification, a voltage $V_B$ appears at the other input of comparator 132 and may be given by equation 4 (EQT. 4):

$$V_B = V_{IN} - I_{BW114} * R_{WB114} \qquad \text{EQT. 4}$$

where:
$R_{WB114}$ is the resistance value of bond wire 114; and
$I_{BW114}$ is an un-mirrored current flowing through bond wire 114.

Because un-mirrored current $I_{BW114}$ is within the specified design value, voltage $V_B$ is greater than or higher than voltage $V_A$ and comparator 132 generates an output signal that serves as an input signal for charge pump 134. In response to the output signal from comparator 132, charge pump 134 generates an output signal that serves as a gate voltage for power MOSFET 106 that is sufficient to turn-on power MOSFET 106. It should be noted that comparator 132 has a high input impedance, thus substantially zero current flows through leadframe lead 109 and bond wire 115 and that un-mirrored current $I_{BW114}$ is the drain current of power MOSFET 106 or power MOSFET 106A.

When un-mirrored current $I_{BW114}$ exceeds the design specification, voltage $V_B$ is less than or lower than voltage $V_A$ and comparator 132 generates an output signal that causes charge pump 134 to generate a voltage at the gate of power MOSFET 106 that turns-off power MOSFET 106. Turning-off power MOSFET 106 opens the current path from input node 136 to output node 138, thereby limiting the current flowing along this path.

Although power MOSFETS 106 and 106A and MOSFET 120 have been described as n-channel MOSFETS it should be understood this is not a limitation of the present invention. MOSFETS 106 and 106A, MOSFET 120, or the combination of power MOSFETS 106 and 106A and MOSFET 120 can be p-channel MOSFETS. When power MOSFETS 106 or 106A are p-channel MOSFETS, current $I_{BW114}$ is a source current and the current through MOSFET 120 is a source current.

By now it should be appreciated that a circuit and a method for limiting current flow have been provided. An advantage of the current limit circuit is that it does not rely on current matching using current mirroring techniques, thus more precise current limiting can be achieved. This lowers the chances of a catastrophic device failure due to an over-current condition. In addition, the circuit and method in accordance with embodiments of the present invention allow the manufacture of circuits comprising multi-chip components wherein the chips are manufactured using different types of semiconductor process flows, e.g., semiconductor chips manufactured using high power process flows and semiconductor chips manufactured using lower power, higher performance integrated circuit processing flows.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for protecting a circuit from an over-current, comprising:
    providing a discrete component formed from a first semiconductor chip having first, second, third, and fourth leadframe leads, first, second, and third bond pads, and comprising a transistor having a drain coupled to the first bond pad, a source coupled to the second bond pad, and a gate coupled to the third bond pad, the first bond pad coupled to the first leadframe lead by a first bond wire and to a second leadframe lead by a second bond wire and the third bond pad coupled to the third leadframe lead;
    generating a first voltage at the first leadframe lead;
    generating a second voltage using an un-mirrored current at the second leadframe lead;
    generating a comparison voltage in response to comparing the first voltage to the second voltage using a comparator that is formed from a monolithically integrated circuit formed from a second semiconductor chip; and
    impeding a flow of the un-mirrored current through the second bond wire in accordance with the comparison voltage, wherein the comparison voltage changes a level of the un-mirrored current flowing through the transistor of the discrete component.

2. The method of claim 1, wherein generating the second voltage includes flowing the un-mirrored current through the second bond wire.

3. The method of claim 1, wherein impeding the flow of the un-mirrored current includes disabling a charge pump in accordance with the comparison voltage.

4. The method of claim 1, wherein impeding the flow of the un-mirrored current includes turning off the transistor.

5. The method of claim 1, wherein generating the first voltage includes subtracting a voltage across a first resistance that is monolithically integrated with the comparator from an input voltage to the monolithically integrated circuit.

6. The method of claim 5, wherein generating the first voltage includes generating the first voltage across the first resistance that is monolithically integrated with the comparator by flowing a current through the first resistance.

7. The method of claim 6, wherein generating the second voltage includes flowing the un-mirrored current through the second bond wire.

8. The method of claim 7, further including generating the un-mirrored current as a current flowing through the transistor, wherein the transistor is a field effect transistor.

9. The method of claim 8, wherein the un-mirrored current is one of a drain current or a source current.

10. A method for limiting an un-mirrored current, comprising:
    providing a discrete component formed from a first semiconductor chip having first, second, third, and fourth leadframe leads, first, second, and third bond pads, and comprising a first transistor having a drain coupled to the first bond pad, a source coupled to the second bond pad, and a gate coupled to the third bond pad, the first bond pad coupled to the first leadframe lead by a first bond wire and to a second leadframe lead by a second bond wire and the third bond pad coupled to the third leadframe lead;
    sensing the un-mirrored current flowing through the first bond wire to generate a first voltage, wherein the first bond pad and the first leadframe lead form first and second portions of the first semiconductor chip that includes the first transistor;

generating a second voltage at a second input of a comparator, wherein the second input of the comparator is connected to the second leadframe lead that is coupled to the first bond pad through the second bond wire, wherein the second leadframe lead forms a third portion of the first semiconductor chip and wherein the comparator forms a first portion of a second semiconductor chip; and operating a charge pump in response to the un-mirrored current, wherein the charge pump generates a signal that controls conduction of current through the first transistor, and wherein the charge pump forms a second portion of the second semiconductor chip.

11. The method of claim 10, wherein operating the charge pump in response to the un-mirrored current includes:
using the un-mirrored current to generate the first voltage;
comparing the first voltage to the second voltage to generate a comparison signal; and
one of enabling or disabling the charge pump in accordance with the comparison signal.

12. The method of claim 11, further including generating the second voltage by:
generating a bias current that flows through a resistor to generate a third voltage; and
subtracting the third voltage from an input voltage.

13. The method of claim 11, further including generating the second voltage by:
generating a bias current that flows through first and second resistors and a drain-to-source current path through a second transistor, wherein the first and second resistors and the second transistor are monolithically integrated with the comparator; and
adding a voltage of a source of operating potential, a voltage drop across the first resistor and a drain-to-source voltage of the second transistor, wherein the sum of the voltage of a source of operating potential, the voltage drop across the first resistor and the drain-to-source voltage of the second transistor serves as the second voltage.

14. The method of claim 10, further including using the first transistor to generate the un-mirrored current.

15. The method of claim 14, wherein the first transistor is a field effect transistor and the un-mirrored current is a drain current of the field effect transistor.

16. The method of claim 14, wherein limiting the un-mirrored current in the integrated circuit comprises turning off the field effect transistor.

17. A current limit circuit, comprising:
a discrete component formed from a first semiconductor chip having first, second, third, and fourth leadframe leads, first, second, and third bond pads, and comprising a transistor having a drain coupled to the first bond pad, a source coupled to the second bond pad, and a gate coupled to the third bond pad, the first bond pad coupled to the first leadframe lead by a first bond wire and to a second leadframe lead by a second bond wire and the third bond pad coupled to the third leadframe lead;
a charge pump having an input and an output, the output coupled to the third leadframe lead; and
a comparator having first and second inputs and an output, the first input coupled to the first bond pad through the first electrical interconnect, the second input coupled to the first bond pad through a second electrical interconnect, and the output coupled to the input of the charge pump, wherein the charge pump and the comparator are formed from a monolithically integrated circuit of a second semiconductor chip.

18. The current limit circuit of claim 17, wherein the first electrical interconnect includes the first leadframe lead and the first bond wire and the second electrical interconnect includes the second leadframe lead and the second bond wire.

19. The current limit circuit of claim 18, further including:
a first resistor having first and second terminals, the first terminal coupled to the first leadframe lead;
a second transistor having a control electrode and first and second current carrying electrodes, the first current carrying electrode of the second transistor coupled to the second terminal of the first resistor, the control electrode coupled for receiving a reference voltage;
a second resistor having first and second terminals, the first terminal of the second resistor coupled to the second current carrying electrode of the second transistor and the second terminal of the second resistor coupled for receiving a source of operating potential; and
an amplifier having first and second inputs and an output, the first input coupled for receiving a reference voltage, the second input coupled to the source of the second transistor, and the output coupled to the control electrode of the second transistor wherein the first resistor, the second transistor, the second resistor, and the amplifier are monolithically integrated with the charge pump and the comparator.

20. The current limit circuit of claim 18, further including a third bond wire, wherein the third bond wire couples the output of the charge pump to the third bond pad.

* * * * *